(12) United States Patent
Lee et al.

(10) Patent No.: US 9,360,748 B2
(45) Date of Patent: Jun. 7, 2016

(54) OPTICAL MASK

(71) Applicant: Samsung Display Co., Ltd., Yongin (KR)

(72) Inventors: Yeon Hwa Lee, Yongin (KR); Joon Gu Lee, Seoul (KR); Jin Baek Choi, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/716,667

(22) Filed: May 19, 2015

(65) Prior Publication Data

US 2016/0062228 A1 Mar. 3, 2016

(30) Foreign Application Priority Data

Sep. 3, 2014 (KR) .................. 10-2014-0117103

(51) Int. Cl.
| | |
|---|---|
| *B41M 5/46* | (2006.01) |
| *G03F 1/54* | (2012.01) |
| *H01L 51/00* | (2006.01) |
| *B41M 5/48* | (2006.01) |

(52) U.S. Cl.
CPC .. *G03F 1/54* (2013.01); *B41M 5/46* (2013.01); *B41M 5/465* (2013.01); *B41M 5/48* (2013.01); *H01L 51/0013* (2013.01)

(58) Field of Classification Search
CPC ............... G03F 1/54; G03F 1/50; G03F 1/52; G03F 1/58; H01L 51/0013; B41M 5/46; B41M 5/465; B41M 5/48
USPC ............................................. 430/5, 199, 200
See application file for complete search history.

(56) References Cited

U.S. PATENT DOCUMENTS

| | | | |
|---|---|---|---|
| 8,093,612 B2 | 1/2012 | Tanaka | |
| 8,277,871 B2 | 10/2012 | Aoyama et al. | |
| 2006/0246240 A1* | 11/2006 | Matsuda | H01L 51/0013 428/32.39 |
| 2009/0197017 A1* | 8/2009 | Tanaka | H01L 51/0013 427/596 |
| 2009/0256169 A1* | 10/2009 | Yokoyama | H01L 51/0096 257/98 |
| 2009/0266479 A1* | 10/2009 | Chung | B32B 33/00 156/247 |
| 2015/0001495 A1* | 1/2015 | Choung | H01L 51/0013 257/40 |

FOREIGN PATENT DOCUMENTS

| | | |
|---|---|---|
| EP | 2 555 594 | 2/2013 |
| KR | 10-2009-0041314 | 4/2009 |
| KR | 10-2010-0136728 | 12/2010 |
| KR | 10-1266828 | 5/2013 |

* cited by examiner

*Primary Examiner* — John A McPherson
(74) *Attorney, Agent, or Firm* — H.C. Park & Associates, PLC

(57) ABSTRACT

An optical mask including a transmissive base substrate, a reflective pattern layer, and a photothermal conversion pattern layer. The reflective pattern layer is disposed on the transmissive base substrate. The reflective pattern layer includes reflectors. The photothermal conversion pattern layer is disposed on the transmissive base substrate among the reflectors. The photothermal conversion pattern layer includes first regions with a first light absorptivity and second regions with a second light absorptivity. The second light absorptivity is greater than the first light absorptivity. The first regions are disposed among the second regions.

19 Claims, 10 Drawing Sheets

OPTICAL MASK

CROSS-REFERENCE TO RELATED APPLICATION

This application claims priority from and the benefit of Korean Patent Application No. 10-2014-0117103, filed on Sep. 3, 2014, which is incorporated by reference for all purposes as if fully set forth herein.

BACKGROUND

1. Field

Exemplary embodiments relate to an optical mask, and more particularly, to an optical mask including a photothermal conversion layer, which may be patterned into high-absorption regions and low-absorption regions.

2. Discussion of the Background

A conventional organic electroluminescence (EL) device may include an anode electrode, a cathode electrode, and organic layers between the anode electrode and the cathode electrode. The organic layers may include a light-emitting layer (EML), as well as include a hole injection layer (HIL), a hole transport layer (HTL), an electron transport layer (ETL), and an electron injection layer (EIL). The organic EL device may be classified as a high molecular organic EL device or a low molecular organic EL device depending upon one or more materials forming the organic layers.

A full-color organic EL device may utilize a patterned EML. If the organic EL device is a low molecular organic EL device, the EML may be patterned using a fine metal mask. On the other hand, if the organic EL device is a high molecular organic EL device, the EML may be patterned using an inkjet printing method or a laser-induced thermal imaging (LITI) method. The LITI method may enable finely patterned organic layers, as well as enable use of a dry etching method rather than a wet etching method, unlike the inkjet printing method.

Patterning of a high molecular organic layer using the LITI method at least utilizes a light source, an organic EL device substrate, i.e., a device substrate (or a target substrate to which an organic layer is to be transferred), and a transfer substrate. The transfer substrate typically includes a base film and a transfer layer including a photothermal conversion layer and an organic film. The photothermal conversion layer of the transfer substrate absorbs light emitted from the light source, and converts it into thermal energy. The organic film of the transfer layer may then be transferred onto the device substrate via the thermal energy. In this manner, an organic layer formed on the transfer substrate may be patterned onto the device substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an optical mask including a photothermal conversion layer having an improved temperature profile.

Additional aspects will be set forth in the detailed description which follows, and, in part, will be apparent from the disclosure, or may be learned by practice of the inventive concept.

According to one or more exemplary embodiments, an optical mask includes: a transmissive base substrate; a reflective pattern layer disposed on the transmissive base substrate, the reflection pattern layer including reflectors; a photothermal conversion pattern layer disposed on the transmissive base substrate among the reflectors, the photothermal conversion pattern layer including first regions with a first light absorptivity and second regions with a second light absorptivity, wherein the second light absorptivity is greater than the first light absorptivity, and wherein the first regions are disposed among the second regions.

According to one or more exemplary embodiments, an optical mask includes: a transmissive base substrate; an adiabatic pattern layer disposed on the transmissive base substrate, the adiabatic pattern layer including adiabatic structures; a photothermal conversion pattern layer disposed on the transmissive base substrate among the adiabatic structures, the photothermal conversion pattern layer including first regions with a first light absorptivity and second regions with a second light absorptivity, wherein the second light absorptivity is greater than the first light absorptivity, and wherein the first regions are disposed among the second regions.

According to exemplary embodiments, an optical mask may include a photothermal conversion pattern layer in which low-absorptivity regions are disposed among high-absorptivity regions. In this manner, the appearance of Gaussian tails may be prevented (or otherwise reduced) on the temperature profile of the photothermal conversion pattern layer. To this end, the temperature profile of the photothermal conversion pattern layer may be improved. That is, the optical mask may provide a more uniform distribution of temperatures across the photothermal conversion pattern layer. Furthermore, the more uniform distribution of temperatures throughout the photothermal conversion pattern layer may enable the transfer profile of an organic material layer formed on the photothermal conversion pattern layer without Gaussian tails. In this manner, the optical mask may improve the uniformity of patterning through the uniformization of the distribution of temperatures throughout the photothermal conversion pattern layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
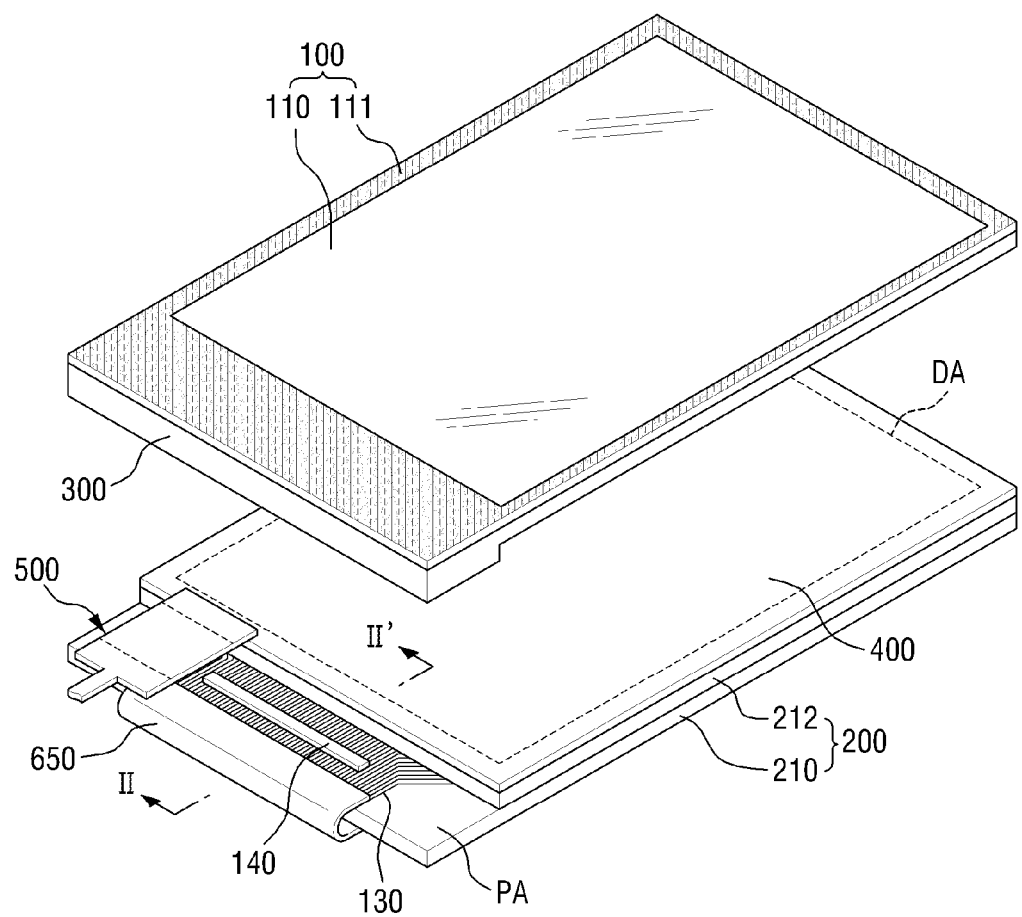
FIG. 1 is an exploded perspective view of an organic light-emitting display (OLED) device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
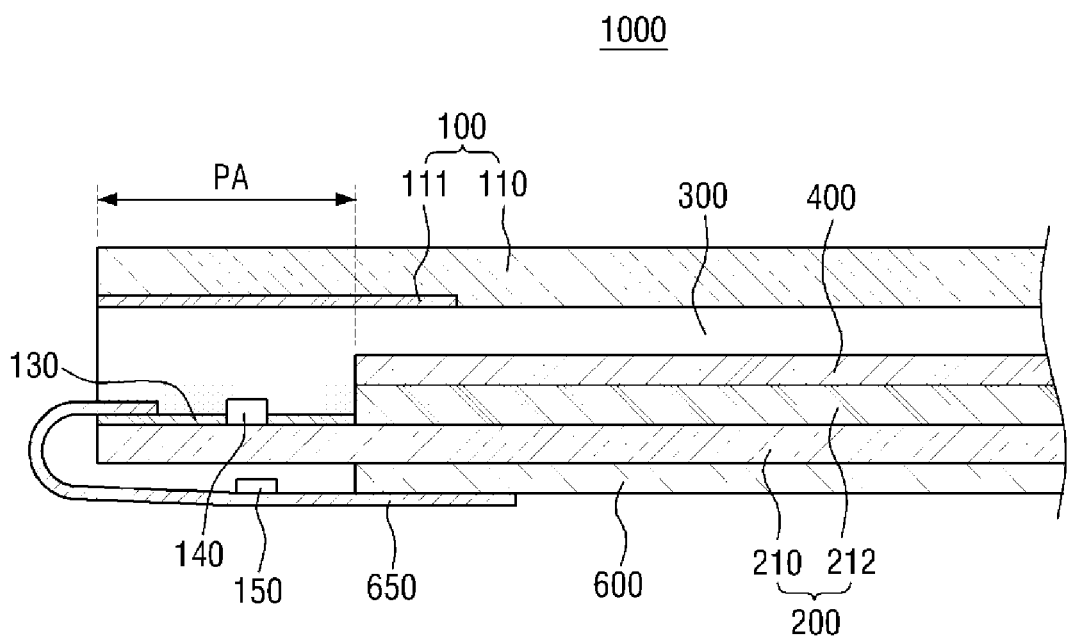
FIG. 2 is a cross-sectional view of the OLED device of FIG. 1 taken along sectional line II-II', according to one or more exemplary embodiments.

FIG. 1 is an exploded perspective view of an organic light-emitting display (OLED) device, and FIG. 2 is a cross-sectional view of the OLED device of FIG. 1 taken along sectional line II-II', according to one or more exemplary embodiments. Referring to FIGS. 1 and 2, an organic light-emitting display device 1000 may include a display panel 200, a cover window 100 disposed on the outside of a display surface of the display panel 200, and a resin layer 300 disposed between the display panel 200 and the cover window 100. The organic light-emitting display device 1000 may also include a touch screen panel 400 disposed on the display surface of the display panel 200 and a touch screen circuit film 500 connected to the touch screen panel 400.

The display panel 200 may include a substrate 210 having a display area DA and a pad area PA, and an encapsulation substrate 212 bonded to the substrate 210. The substrate 210 and the encapsulation substrate 212 may be formed of glass or a polymer film, or any other suitable material. In the display area DA of the substrate 210, a plurality of signal lines (including scan lines and data lines, neither of which are illustrated) and a plurality of pixels (not shown) may be provided. In the pad area PA of the substrate 210, a plurality of metal wires 130 connected to the plurality of signal lines may be provided. Although referred to as "metal wires" 130, wires 130 may be formed from any suitable conductive material.

The display panel 200 may also include a first integrated circuit (IC) chip 140 mounted in the pad area PA in a chip-on-glass (COG) manner. The first IC chip 140 may include one of a scan driver (not illustrated) and a data driver (not illustrated). The scan driver may apply a scan signal to the plurality of pixels via the scan lines, and the data driver may apply a data signal to the plurality of pixels via the data lines.

The encapsulation substrate 212 may be smaller than the substrate 210, and may be attached over the display area DA of the substrate 210. The substrate 210 and the encapsulation substrate 212 may be bonded together by a sealant (not illustrated) applied along the edges of the encapsulation substrate 212. The encapsulation substrate 212 may seal the plurality of pixels and may protect the plurality of pixels from an ambient environment, e.g., external air, moisture, debris, etc. A thin encapsulation layer in which at least one organic layer and at least one inorganic layer are alternately stacked may be provided, instead of the encapsulation substrate 212.

The organic light-emitting display device 1000 may also include a printed circuit board 600 where a control circuit for transmitting a control signal to the display panel 200 may be formed (or otherwise disposed) and a main circuit film 650 connecting the display panel 200 and the PCB 600. The main circuit film 650 may be attached over the pad area PA, and may be electrically connected to the metal wires 130. The main circuit film 650 may be bent toward the opposite side of the display surface of the display panel 200 for the PCB 600 to be disposed on the opposite side of the display surface of the display panel 200. Whichever of the scan driver and the data driver is not included in the first IC chip 140 may be mounted on the main circuit film 650 in a chip-on-film (COF) manner. A second IC chip 150 may include whichever of the scan driver and the data driver is not included in the first IC chip 140, and may be mounted on the main circuit film 650 in the COF manner.

The plurality of pixels, which are provided on the substrate 210, may emit light toward the encapsulation substrate 212. The outer surface of the encapsulation substrate 212 may function as a display surface of the display panel 200. The touch screen panel 400 may be attached onto the outer surface of the encapsulation substrate 212 to overlap the display area DA, and the touch screen circuit film 500 may be electrically connected to electrodes (not illustrated) on the touch screen panel 400. The touch screen circuit film 500 may be disposed above the pad area PA.

The cover window 100 may be disposed on the outside of the display surface of the display panel 200, and may protect the display panel 200 from external shock, scratches, contaminants, etc. The cover window 100 may be formed of a transparent (or at least translucent) material, such as glass or transparent plastic, or any other suitable material, and may cover both the encapsulation substrate 212 and the pad area PA. The cover window 100 may include a light-transmitting part 110 corresponding to the display area DA and a light-shielding part 111 provided on the outside of the light-transmitting part 110. The light-shielding part 111 may cover part of the display panel 200 where an image is not displayed.

The resin layer 300 may be disposed between the display panel 200 and the cover window 100, and may bond the display panel 200 and the cover window 100 together. The resin layer 300 may fill the entire gap between the touch screen panel 400 and the cover window 100 and at least part of the gap between the pad area PA and the cover window 100. In response to the resin layer 300 being formed to be as large as the substrate 210 and to completely fill the gap between the display panel 200 and the cover window 100, the resin layer 300 may offer increased (e.g., maximum) bonding performance. The resin layer 300 may include an acryl-based resin that is curable by ultraviolet (UV) light. The resin layer 300 may be applied in its initial liquid state or in a paste state to the cover window 100, and may be cured by UV light after the display panel 200 and the cover window 100 are stacked together.

Figure 3:
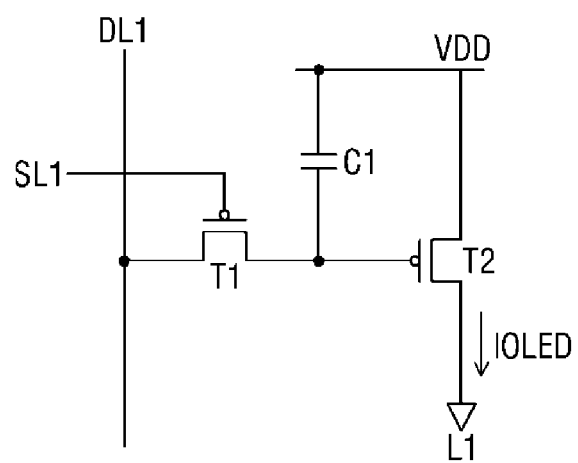
FIG. 3 is a circuit diagram of a pixel of a display panel of the OLED device of FIG. 1, according to one or more exemplary embodiments.
Figure 4:
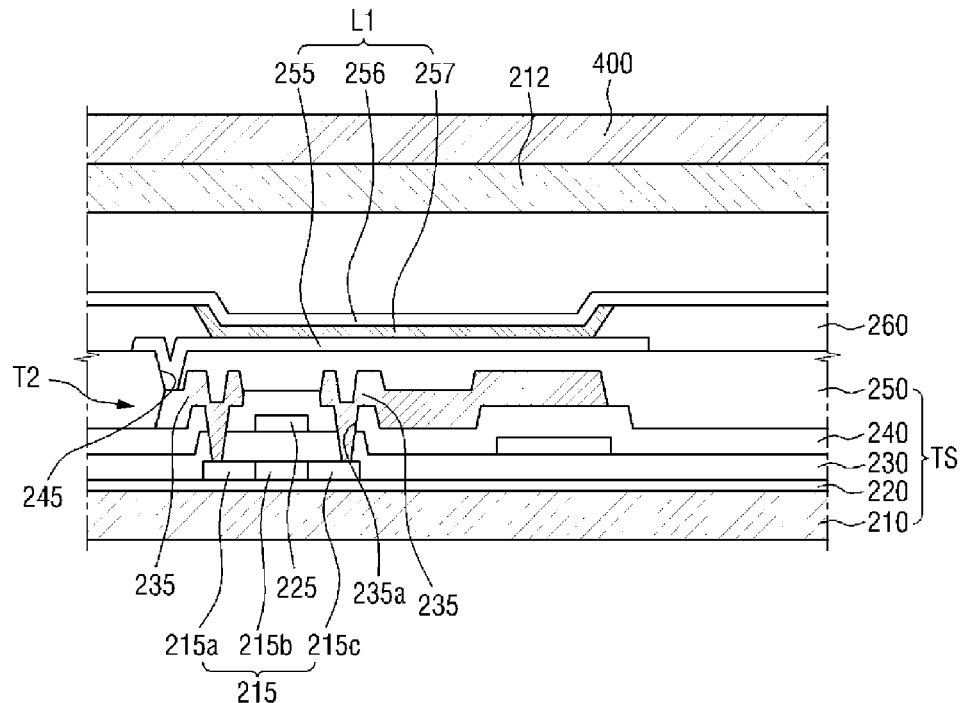
FIG. 4 is a cross-sectional view of part of the display panel of the OLED device of FIG. 1, according to one or more exemplary embodiments.

FIG. 3 is a circuit diagram of a pixel of a display panel of the OLED device of FIG. 1, and FIG. 4 is a cross-sectional view of part of the display panel of the OLED device of FIG. 1, according to one or more exemplary embodiments.

Referring to FIGS. 3 and 4, a pixel may include an organic light-emitting diode (OLED) L1 and a driving circuit unit (T1, T2, C1). The OLED L1 may include a pixel electrode 255, an organic light-emitting layer 257, and a common electrode 256. The driving circuit unit (T1, T2, C1) may include at least two thin-film transistors (TFTs), e.g., a switching transistor T1 and a driving transistor T2, and at least one capacitor C1. One of the pixel electrode 255 and the common electrode 256 may be an electron injection electrode, and the other electrode may be a hole injection electrode. In response to electrons and holes being injected into the organic light-emitting layer 255, the electrons and the holes may be combined together in the organic light-emitting layer 255 to generate excitons. The excitons may emit light while releasing energy.

The switching transistor T1 may be connected to a scan line SL1 and a data line DL1, and may transmit a data voltage applied to the data line DL1 to the driving transistor T2 according to a switching voltage applied to the scan line SL1. The capacitor C1 may be connected to the switching transistor T1 and a power line VDD, and may store a voltage corresponding to the difference between the data voltage transmitted by the switching transistor T1 and a voltage supplied to the power line VDD. The driving transistor T2 may be connected to the power line VDD and the capacitor C1. The driving transistor T2 may apply an output current IOLED, which may be proportional to the square of the difference between the voltage stored in the capacitor C1 and a threshold voltage, to the OLED L1, and the OLED L1 may emit light at an intensity corresponding to the output current IOLED.

The driving transistor T2 may include a semiconductor layer 215, a gate electrode 225, and source/drain electrodes 235. The pixel electrode 255 may be connected to the drain electrode 235 of the driving transistor T2. The pixel electrode 255 may be formed of a metal layer that may reflect light, and the common electrode 173 may be formed of a transparent conductive layer that may transmit light. Light generated by the organic light-emitting layer 257 may be reflected by the pixel electrode 255, may penetrate the common electrode 256 and the encapsulation substrate 212, and may be emitted to the outside of the display panel 200.

As illustrated in FIG. 4, the display panel 200 may include the substrate 210, the semiconductor layer 215, a buffer layer 220, the gate electrode 225, a gate insulating layer 230, the source/drain electrodes 235, an interlayer dielectric layer 240, a planarization layer 250, a pixel-defining layer 260, and the encapsulation substrate 212. The touch screen panel 400 may be disposed on the encapsulation substrate 212.

The buffer layer 220 may be formed on the substrate 210. The buffer layer 220 may be formed as a silicon nitride layer, a silicon oxide layer, a silicon oxynitride layer, or any other suitable material layer, or a multiple layer. The semiconductor layer 215 may be formed by depositing an amorphous silicon layer on the buffer layer 220, patterning the amorphous silicon layer, and crystallizing the patterned amorphous silicon layer. The gate insulating layer 230 may be formed on the semiconductor layer 215.

The gate electrode 225 may be formed on part of the gate insulating layer 230 corresponding to the semiconductor layer 215. The gate insulating layer 230 may be formed as a silicon oxide layer, a silicon nitride layer, a silicon oxynitride layer, or any other suitable material layer, or a multiple layer. A source region 215c and a drain region 215a may be formed by implanting conductive impurities into the semiconductor layer 215 while using the gate electrode 225 as a mask. A channel region 215b may be defined between the source region 215a and the drain region 215c.

The interlayer insulating layer 240 may be formed on the entire (or substantially entire) surface of the substrate 210 to be disposed on the gate electrode 225. The interlayer dielectric layer 240 may be formed as a silicon oxide layer, a silicon nitride layer, a silicon oxynitride layer, or any other suitable material layer, or a multiple layer. Contact holes 235a may be formed through the gate insulating layer 230 and the interlayer dielectric layer 240. The contact holes 235a may expose the source region 215a and the drain region 215c, respectively.

The source/drain electrodes 235 may be formed by depositing a conductive layer on the substrate 210 where the contact holes 235a are formed and patterning the conductive layer. The source/drain electrodes 235 may be connected to the source region 215a and the drain region 215c, respectively, via the contact holes 235a, respectively. The planarization layer 250 may be formed on the entire (or substantially entire) surface of the substrate 210 to be disposed on the source/drain electrodes 235. The planarization layer 250 may be formed of any suitable material, such as a material selected from the group consisting of polyimide, a benzocyclobutene series resin, and acrylate.

A via hole 245 may be formed to expose the source/drain electrodes 235. One of the source/drain electrodes 235 exposed through the via hole 245 may be connected to the pixel electrode 255 formed on the planarization layer 250. The pixel electrode 255 may be formed of indium tin oxide (ITO), indium zinc oxide (IZO), or any other suitable material with a high work function, and may include a reflective layer as a lower layer. The reflective layer may be formed of a metal with high reflectivity, such as aluminum (Al), aluminum-neodymium (Al—Nd), silver (Ag), etc. In response to the organic light-emitting display device 1000 being a bottom emission type display device, the pixel electrode 255 may not include the reflective layer. Instead, the pixel electrode 255 may include a transparent conductive layer formed of one of ITO, IZO, etc. It is also contemplated that the pixel electrode may be formed from aluminum zinc oxide (AZO), gallium zinc oxide (GZO), etc. Further, one or more conductive polymers (ICP) may be utilized, such as, for example, polyaniline (PANI), poly(3,4-ethylenedioxythiophene)poly(styrenesulfonate) (PEDOT:PSS), etc.

The pixel-defining layer 260 may be formed on the pixel electrode 255, and may then be patterned, forming an opening. The pixel-defining layer 260 may define the plurality of pixels of the display panel 200. The pixel-defining layer 260 may be formed of one selected from the group consisting of polyimide (PI), a benzocyclobutene series resin, and acrylate. It is contemplated, however, that any other suitable material may be utilized in association with exemplary embodiments described herein.

The circuitry of the pixel of FIG. 3 and the cross-sectional structure of the display panel 200 of FIG. 4 are exemplary, and, thus, the organic light-emitting display device 1000 is not limited thereto. Accordingly, various modifications can be made to the organic light-emitting display device 1000 without departing from the scope of the claimed subject matter.

Figure 5:
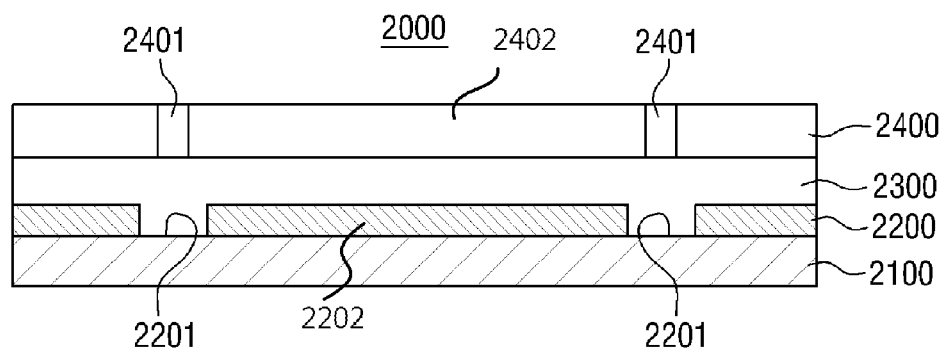
FIG. 5 is a cross-sectional view of an optical mask, according to one or more exemplary embodiments.

FIG. 5 is a cross-sectional view of an optical mask, according to one or more exemplary embodiments.

Referring to FIG. 5, an optical mask 2000 may include a transmissive base substrate 2100, a reflective pattern layer 2200, an adiabatic layer 2300, and a photothermal conversion pattern layer 2400.

The transmissive base substrate 2100 may transmit light emitted from a flash lamp or a tungsten halogen lamp or laser beams. The transmissive base substrate 2100 may be a flat panel-type substrate. The transmissive base substrate 2100 may be, but is not limited to, one selected from the group consisting of a glass substrate, a quartz substrate, and a synthetic resin substrate, which is formed of a transparent polymer with excellent light transmittance, such as polyester, polyacryl, polyepoxy, polyethylene, polystyrene, and polyethylene terephthalate. It is contemplated, however, that any other suitable material may be utilized in association with exemplary embodiments described herein.

Light (for example, beams L1 illustrated in FIG. 6) may reach the reflective pattern layer 2200 through the transmissive base substrate 2100. Examples of a light source (not illustrated) may include a laser, a flash lamp, or a tungsten halogen lamp. The light source may be disposed below a second surface of the transmissive base substrate 2100. The reflective pattern layer 2200 may be formed on a first surface of the transmissive base substrate 2100.

The reflective pattern layer 2200 may be formed on the first surface of the transmissive base substrate 2100. The reflective pattern layer 2200 may include incisions 2201, which transmit light emitted from below the second surface of the transmissive base substrate 2100 and reflectors 2202. The incisions 2201 may be disposed among the reflectors 2202. The incisions 2201 may expose parts of the transmissive base substrate 2100 between the reflectors 2202. For example, the incisions 2201 may serve as windows for transmitting light emitted from the light source.

The reflectors 2202 may reflect light emitted from below the second surface of the transmissive base substrate 2100. The reflectors 2202 may be formed of a material with excellent (or relatively high) reflectance for light emitted from the light source. The reflectors 2202 may be flat panel-type reflective layers. For example, the reflectors 2202 may be formed of one selected from the group consisting of aluminum (Al), gold (Au), silver (Ag), platinum (Pt), copper (Cu), an Al alloy, an Ag Alloy, and indium oxide-tin oxide. Any other suitable material may be utilized in association with exemplary embodiments described herein. The reflective pattern layer 2200 may be formed by various methods, for example, sputtering, electron beam deposition and vacuum deposition.

The adiabatic layer 2300 may prevent (or otherwise reduce) dispersion of thermal energy generated by the photothermal conversion pattern layer 2400. The adiabatic layer 2300 may be formed on first surfaces of the reflectors 2202 and parts of the first surface of the transmissive base substrate 2100 exposed through the incisions 2201. The adiabatic layer 2300 may have a flat top surface. The adiabatic layer 2300 may be formed of a material with high light transmittance and low thermal conductance. The adiabatic layer 2300 may be formed of a material with lower thermal conductance than the photothermal conversion pattern layer 2400. For example, the adiabatic layer 2300 may have a thermal conductance of 1.5 W/mK or lower.

The adiabatic layer 2300 may be formed of one of titanium oxide, silicon oxide (SiOx), silicon oxynitride, zirconium oxide, silicon carbide, silicon nitride (SiNx) or an organic polymer, but the invention is not limited thereto. The adiabatic layer 2300 may be thicker than the photothermal conversion pattern layer 2400.

The photothermal conversion pattern layer 2400 may absorb light within an infrared-visible light range, transmitted through the transmissive base substrate 2100, the incisions 2202, and the adiabatic layer 2300, and may convert the absorbed light into thermal energy. The photothermal conversion pattern layer 2400 may be formed by various methods, for example, sputtering, electron beam deposition, and vacuum deposition. The photothermal conversion pattern layer 2400 may be formed on a first surface of the adiabatic layer 2300. The photothermal conversion pattern layer 2400 may be divided into first regions 2401, which overlap the incisions 2201, respectively, and may have low light absorptivity, and second regions 2402, which may have higher light absorptivity than the first regions 2401.

The first regions 2401 and the second regions 2402 may have a light absorptivity of 50% or higher in the infrared-visible light range. For example, the first regions 2401 and the second regions 2402 of the optical mask 2000 may both generate heat in the infrared-visible light range. The optical mask 2000 may be for providing a uniform distribution of temperatures throughout the first regions 2401 and the second regions 2402, and the absorptivity of the first regions 2401 and the second regions 2402 may not be selectively turned on or off. The first regions 2401 and the second regions 2402 may be formed of a metal material with high absorptivity, such as molybdenum (Mo), chromium (Cr), titanium (Ti), tin (Sn), tungsten (W) and an alloy. The first regions 2401 may be provided amongst the second regions 2402.

A conventional photothermal conversion layer of an optical mask is typically formed of a single material, and is provided on the entire surface of an adiabatic layer. As a result, the distribution of thermal energy generated by the photothermal conversion layer upon the incidence of light through each incision of a reflective pattern layer becomes irregular, especially at the center and on the edges of each part of the photothermal conversion layer overlapping each incision. The temperature profile of the photothermal conversion layer typically has a convex shape at the center of each part of the photothermal conversion layer overlapping each incision due to a high temperature and usually has a temperature gradient that gradually decreases from the center to the edges of each part of the photothermal conversion layer overlapping each incision caused, at least in part, because of the diffusion of heat on the edges of each part of the photothermal conversion layer overlapping each incision.

The center and the edges of each part of the photothermal conversion layer overlapping each incision both utilize heat to transfer an organic material layer. However, the conventional optical mask cannot sufficiently generate heat on the edges of each part of the photothermal conversion layer overlapping each incision. As a result, the transfer of an organic material may occur only at the center of each part of the photothermal conversion layer overlapping each incision, where a sufficiently high temperature for the organic material to be transferred is provided, but not on the edges of each part of the photothermal conversion layer overlapping each incision. Accordingly, the thickness of a transferred organic material layer formed on a target substrate may become undesirably thin or at least undesirably non-uniform.

According to exemplary embodiments, however, the photothermal conversion pattern layer 2400 of the optical mask 2000 may be formed, through patterning, such that high-absorptivity regions may be provided to cover the edges of each of the parts of the photothermal conversion pattern layer 2400 overlapping the incisions 2201, respectively, and low-absorptivity regions may be provided to cover the center of each of the parts of the photothermal conversion pattern layer 2400 overlapping the incisions 2201, respectively. The difference between the light absorptivity of the low-absorptivity regions, i.e., the first regions 2401, and the light absorptivity of the high-absorptivity regions, i.e., the second regions 2402, may range from about 10% to about 40%, in which case, the distribution of temperatures throughout the photothermal conversion pattern layer 2400 may become regular.

In response to the difference between the light absorptivity of the first regions 2401 and the light absorptivity of the second regions 2402 being less than 10%, the difference between the level of thermal energy generated in the first regions 2401 and the level of thermal energy generated in the second regions 2402 may be undesirably small. On the other hand, in response to the difference between the light absorptivity of the first regions 2401 and the light absorptivity of the second regions 2402 exceeding 40%, the difference between the level of thermal energy generated in the first regions 2401 and the level of thermal energy generated in the second regions 2402 may be undesirably large, and as a result, an organic material may be selectively transferred.

The second regions 2402 may be formed to overlap the reflectors 2202, respectively, as illustrated in FIG. 5.

Figure 6:
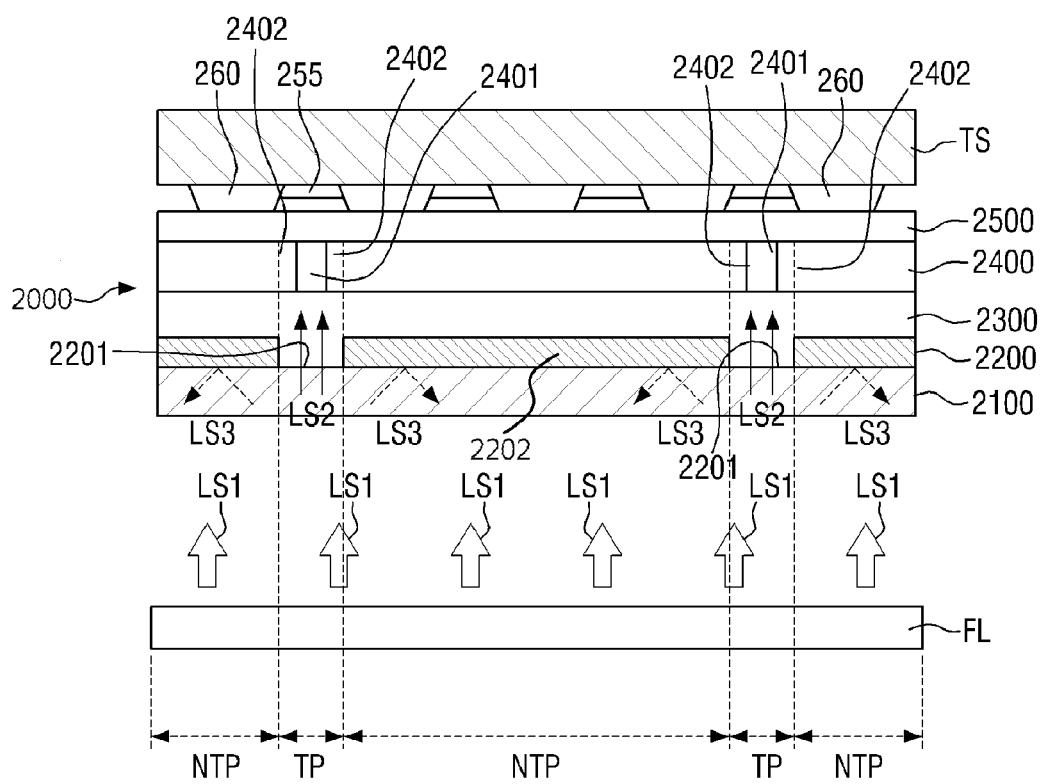
FIG. 6 is a cross-sectional view illustrating the propagation of light through at least a portion of the optical mask of FIG. 5, according to one or more exemplary embodiments.
Figure 7:
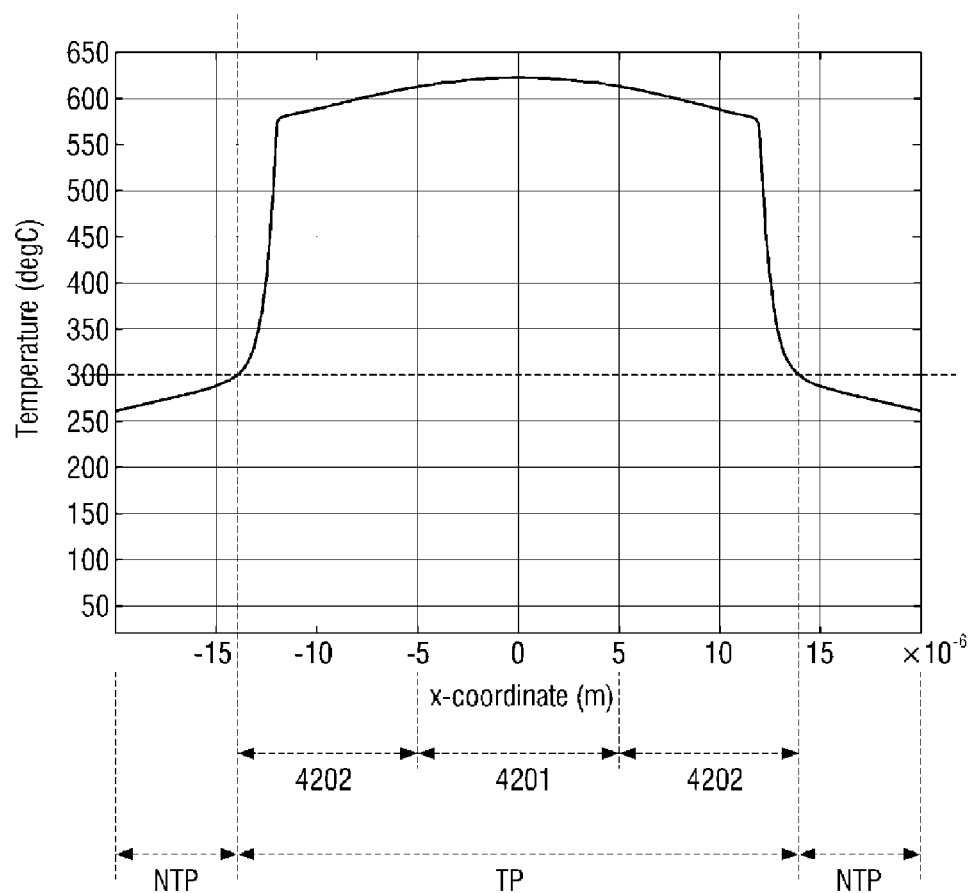
FIG. 7 is a graph illustrating the temperature profile of a photothermal conversion pattern layer of the optical mask of FIG. 5, according to one or more exemplary embodiments.

FIG. 6 is a cross-sectional view illustrating the propagation of light through at least a portion of the optical mask of FIG. 5, according to one or more exemplary embodiments. FIG. 7 is a graph illustrating the temperature profile of the photothermal conversion pattern layer 2400 of the optical mask 2000, according to one or more exemplary embodiments.

Referring to FIG. 6, an organic material layer 2500 may be formed on a first surface of the photothermal conversion pattern layer 2400. The organic material layer 2500 may include various organic layers that may be included in an organic light-emitting display device, e.g., an organic light-emitting layer (EML), a hole injection layer (HIL), a hole transport layer (HTL), an electron injection layer (EIL), and an electron transport layer (ETL).

A target substrate TS may be a thin-film transistor (TFT) substrate of an organic light-emitting display device. A plurality of pixel-defining layers 260 may be formed on a first surface of the target substrate TS facing the organic material layer 2500, and may be isolated from one another. A plurality of pixel electrodes 255 may be exposed through the gaps between the pixel-defining layers 260. First surfaces of the pixel electrodes 255 may be areas onto which an organic material is to be transferred, and the pixel electrodes 255 may be disposed to overlap the incisions 2201, respectively.

For an improved transfer profile of the organic material layer 2500, the distance between the target substrate TS and the optical mask 2000 may be minimized. The target substrate TS and the optical mask 2000 may be firmly attached to each other with the organic material layer 2500. The organic material layer 2500 may be formed by various methods, for example, a wet etching method such as spin coating, spray coating, inkjet printing, deep coating, casting, die coating, roll coating, blade coating, bar coating, gravure coating, or printing, and a dry etching method such as vacuum deposition and sputtering.

A flash lamp FL, as a light source, may be provided below the optical mask 2000. The flash lamp FL may apply beams LS1 to the second surface of the transmissive base substrate 2100, e.g., the entire surface thereof. The beams LS1 may penetrate the transmissive base substrate 2100. Some of the beams LS1, i.e., beams LS2, may be incident upon adiabatic layer 2300 through the incisions 2201, and may also be incident upon parts of the photothermal conversion pattern layer 2400 overlapping the incisions 2201, respectively, through the transmissive buffer layer 2300.

The beams LS2, which may be incident upon the photothermal conversion pattern layer 2400, may be received by the first regions 2401 and the second regions 2402, and may then be converted into heat. The temperature profile in transmissive areas TP, which are areas overlapping the incisions 2201, respectively, is illustrated in FIG. 7. Some of the beams LS1 transmitted through the transmissive base substrate 2100, i.e., beams LS3, may be reflected by the reflectors 2202 of the reflective pattern layer 2200, and may then travel back toward the flash lamp FL. Areas overlapping the reflectors 2202, of the reflective pattern layer 2200 may be referred to as non-transmissive areas NTP.

Referring to FIG. 7, the distribution of temperatures may be relatively uniform in a first region 4201 and second regions 4202 of a transmissive area TP with an average temperature of about 600° C., and the temperature profile in the second regions 4202, and particularly, at the boundaries between the transmissive part and non-transmissive areas NTP, may show a sharp increase to the average temperature of about 600° C. For example, the photothermal conversion pattern layer 2400 may have a temperature profile having no (or relatively small number of) Gaussian tails. The sharp temperature may increase in the second regions 4202. Further, since the distribution of temperatures may be uniform throughout the entire transmissive area TP, the problems associated with conventional optical masks, such as thinner organic material layers than design specifications, may be addressed.

Figure 8:
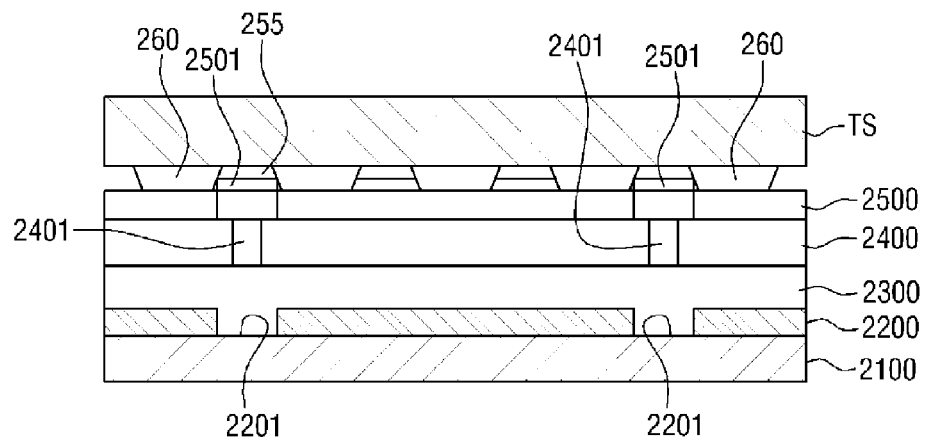
FIG. 8 is a cross-sectional view illustrating the formation of an organic material layer on a target substrate using the optical mask of FIG. 5, according to one or more exemplary embodiments.

FIG. 8 is a cross-sectional view illustrating the formation of an organic material layer on the target substrate TS using the optical mask 2000, according to one or more exemplary embodiments.

Referring to FIGS. 6 and 8, due to heat generated in parts of the photothermal conversion pattern layer 2400 corresponding to the transmissive areas TP, parts of the organic material layer 2500 in the transmissive areas TP may be sublimated, and may thus be transferred onto the target substrate TS. As a result, an organic material layer 2501 may be formed on the first surfaces of the pixel electrodes 255 of the target substrate TS, and at the same time, the parts of the organic material layer 2500 that are transferred onto the target substrate TS to form the organic material layer 2501 may be removed so as to expose the photothermal conversion pattern layer 2400.

Figure 9:
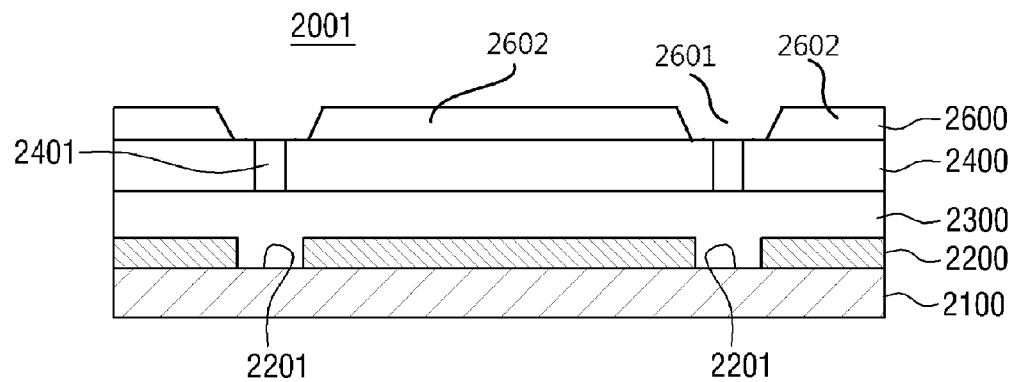
FIG. 9 is a cross-sectional view of an optical mask, according to one or more exemplary embodiments.

FIG. 9 is a cross-sectional view of an optical mask, according to one or more exemplary embodiments. The optical mask 2001 differs from the optical mask 2000 of FIG. 5 in that it may include the buffer pattern layer 2600.

Referring to FIG. 9, an optical mask 2001 may include a buffer pattern layer 2600. The buffer pattern layer 2600 may include a plurality of openings 2601, which may be formed to overlap transmissive areas TP, and a plurality of barriers 2602, which may be formed to overlap non-transmissive areas NTP, respectively. The buffer pattern layer 2600 may allow the organic material layer 2500 to be transferred onto the target substrate TS only in the transmissive areas TP. For example, the barriers 2602 of the buffer pattern layer 2600 may prevent the diffusion of the organic material layer 2500 from the transmissive areas TP to the non-transmissive areas NTP. The buffer pattern layer 2600, like the adiabatic layer 2300, may be formed of a material with high light transmittance and low thermal conductance. For example, the buffer pattern layer 2600 may have a thermal conductance of 1.5 W/mK or lower. The buffer pattern layer 2600 may be formed of one of titanium oxide (TiOx), silicon oxide (SiOx), silicon oxynitride, zirconium oxide, silicon carbide, silicon nitride (SiNx) or an organic polymer, but the invention is not limited thereto. It is contemplated, however, that any suitable material may be utilized in association with exemplary embodiments described herein.

Figure 10:
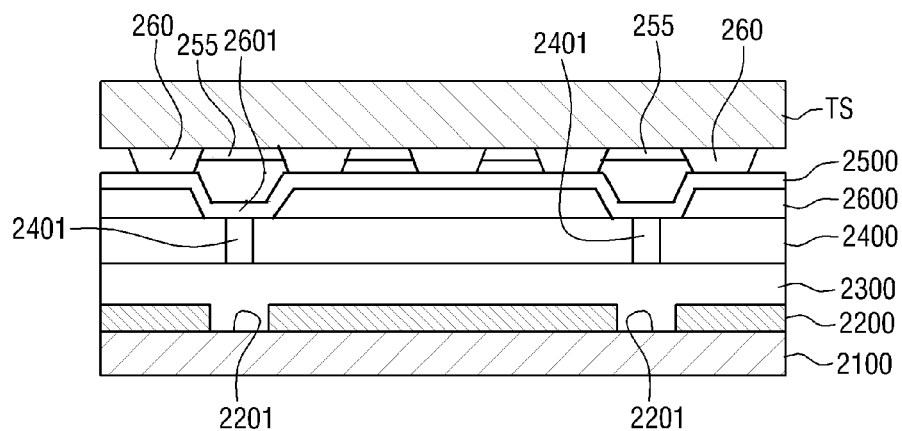
FIG. 10 is a cross-sectional view illustrating the propagation of light through at least a portion of the optical mask of FIG. 9, according to one or more exemplary embodiments.
Figure 11:
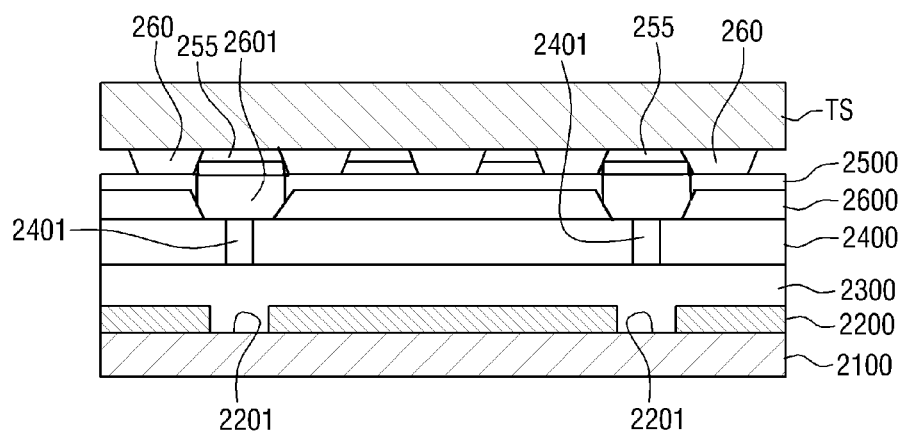
FIG. 11 is a cross-sectional view illustrating the formation of an organic layer on a target substrate using the optical mask of FIG. 9, according to one or more exemplary embodiments.

FIG. 10 is a cross-sectional view illustrating the propagation of light through at least a portion of the optical mask 2001, according to one or more exemplary embodiment. FIG. 11 is a cross-sectional view illustrating the formation of an organic material layer on a target substrate using the optical mask 2001, according to one or more exemplary embodiments.

Referring to FIGS. 10 and 11, the optical mask 2001 differs from the optical mask 2000 of FIG. 5 in that the organic material layer 2500 may be formed on a first surface of the buffer pattern layer 2600. Accordingly, even after the transfer of the organic material layer 2500 onto the target substrate TS as the organic material layer 2501, the organic material layer 2500 may still remain on the first surface of the buffer pattern layer 2600, and particularly, on the barriers 2602 of the buffer pattern layer 2600.

Figure 12:
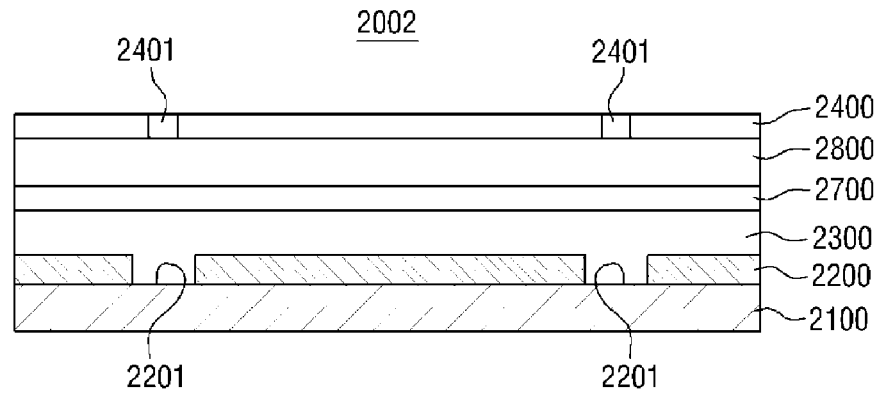
FIG. 12 is a cross-sectional view of an optical mask, according to one or more exemplary embodiments.

FIG. 12 is a cross-sectional view of an optical mask, according to one or more exemplary embodiments.

Referring to FIG. 12, an optical mask 2002 may include a photothermal conversion layer 2700 interposed between a photothermal conversion pattern layer 2400 and a transmissive buffer layer 2300, and may also include a metal oxide layer 2800 interposed between the photothermal conversion layer 2700 and the photothermal conversion pattern layer 2400. The photothermal conversion layer 2700 may be formed of a single material with a uniform light absorptivity, and thus differs from the photothermal conversion pattern layer 2400, which may be formed of two materials with different light absorptivities through patterning. The photothermal conversion layer 2700 may be formed on a first surface of the transmissive buffer layer 2300. The photothermal conversion layer 2700 may absorb light within an infrared-visible light range, transmitted through a transmissive base substrate 2100, a plurality of incisions 2202 and the transmissive buffer layer 2300, and may convert the absorbed light into thermal energy.

The photothermal conversion layer 2700 may be formed by various methods, for example, sputtering, electron beam deposition, and vacuum deposition. The photothermal conversion layer 2700 may be formed of a metal material with high absorptivity, such as Mo, Cr, Ti, Sn, W or an alloy. The photothermal conversion layer 2700 may be thinner than the photothermal conversion pattern layer 2400, and may thus properly transmit light.

The metal oxide layer 2800 may vary the refractive index of light transmitted through the photothermal conversion layer 2700 for the light to travel toward the photothermal conversion pattern layer 2400. Some of the light transmitted through the metal oxide layer 2800 may be reflected by the second surface of the photothermal conversion layer 2700 and may be incident again upon the photothermal conversion layer 2700. The metal oxide layer 2800 may be formed of, but is not limited to, a transmissive metal oxide. For example, the metal oxide layer 2800 may be formed of one selected from the group consisting of ITO, IZO and indium gallium zinc oxide (IGZO).

Light refracted into the photothermal conversion pattern layer 2400 by the metal oxide layer 2800 and light incident again upon the photothermal conversion layer 2700 may be absorbed, and converted into heat, by the photothermal conversion pattern layer 2400 and the photothermal conversion layer 2700, respectively, and the heat may improve the uniformity of the distribution of temperatures throughout first regions 2401 and second regions 2402 of the photothermal conversion pattern layer 2400.

Figure 13:
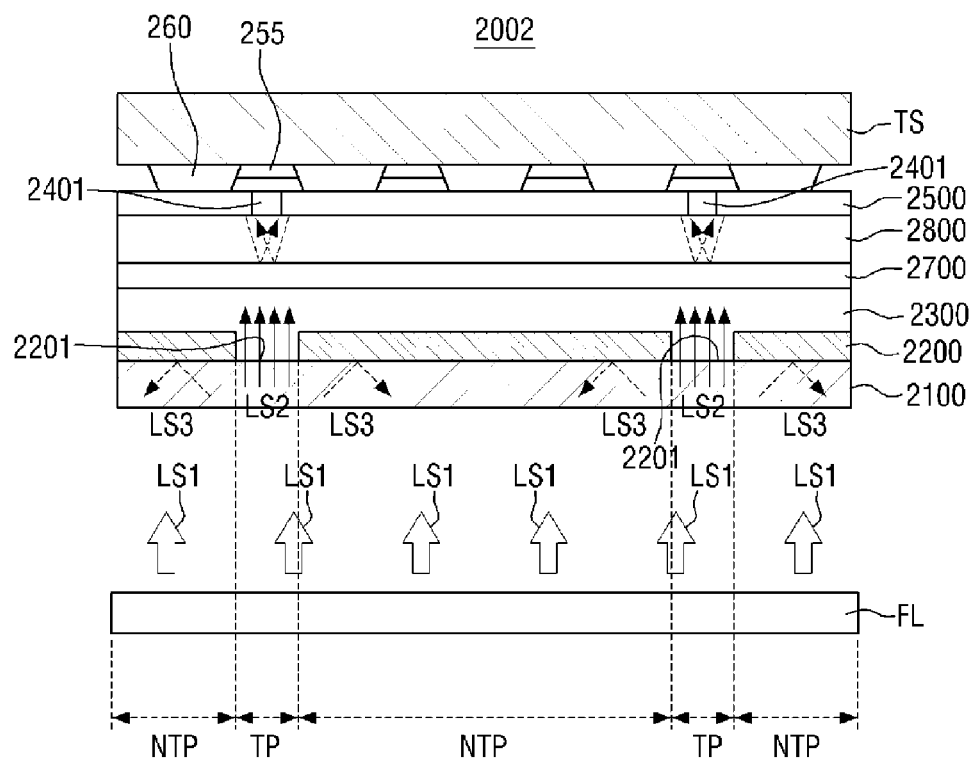
FIG. 13 is a cross-sectional view illustrating the propagation of light through at least a portion of the optical mask of FIG. 12, according to one or more exemplary embodiments.
Figure 14:
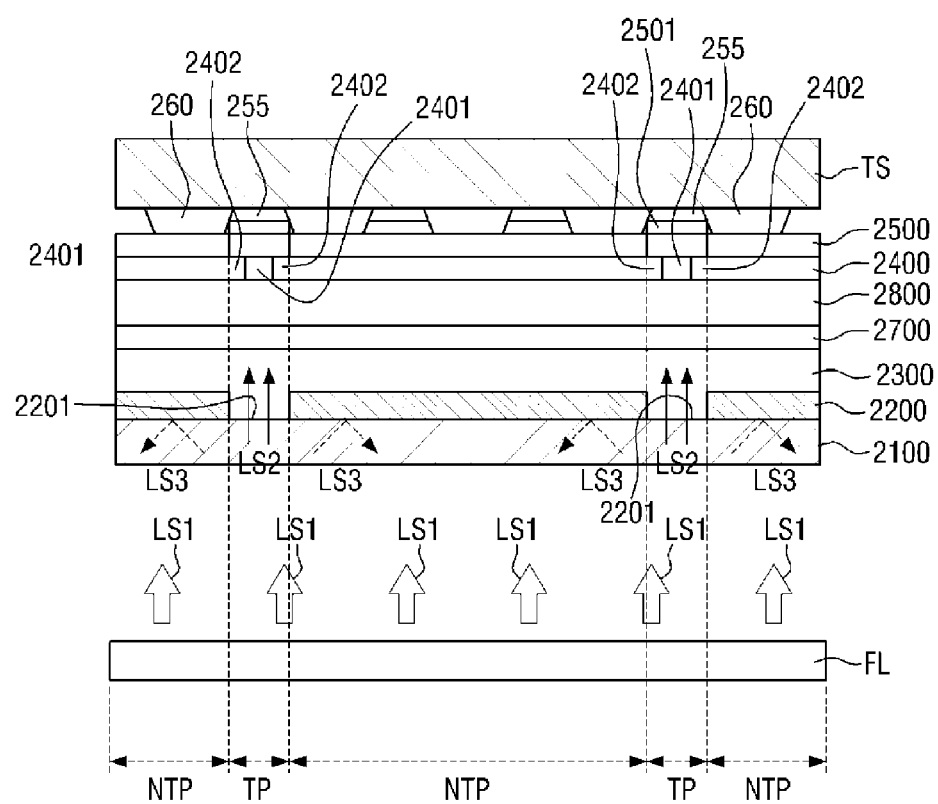
FIG. 14 is a cross-sectional view illustrating the formation of an organic layer on a target substrate using the optical mask of FIG. 12, according to one or more exemplary embodiments.

FIG. 13 is a cross-sectional view illustrating the propagation of light through at least a portion of the optical mask 2002, according to one or more exemplary embodiments. FIG. 14 is a cross-sectional view illustrating the formation of an organic layer on a target substrate by using the optical mask 2002, according to one or more exemplary embodiments.

Referring to FIGS. 13 and 14, in transmissive areas TP, beams LS1 emitted from a flash lamp FL may be incident upon the organic material layer 2500 through the transmissive base substrate 2100, the incisions 2201, the adiabatic layer 2300, the photothermal conversion layer 2700, the metal oxide layer 2800, and the photothermal conversion pattern layer 2400. The example illustrated in FIG. 13 differs from the example illustrated in FIG. 6 in that in the transmissive areas TP, beams LS2 may be incident upon the photothermal conversion pattern layer 2400 through the photothermal conversion layer 2700 and the metal oxide layer 2800. Some of the beams LS2 may be converted into heat by the photothermal conversion layer 2700, and some of the beams LS2 may be incident upon the metal oxide layer 2800 and may then travel toward the photothermal conversion pattern layer 2400. Accordingly, the temperature profile in the first regions 2401 and the second regions 2402 of the photothermal conversion pattern layer 2400 may be improved to have a rectangular shape.

Figure 15:
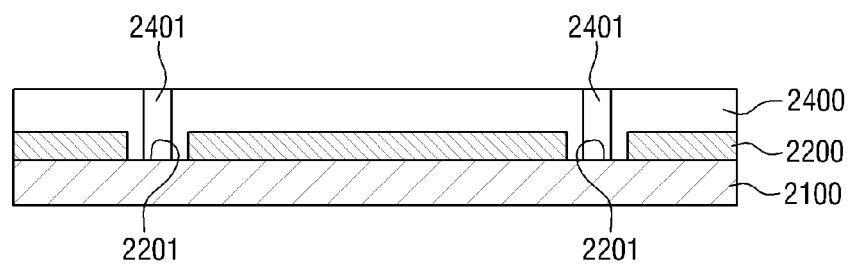
FIG. 15 is a cross-sectional view of an optical mask, according to one or more exemplary embodiments.

FIG. 15 is a cross-sectional view of an optical mask, according to one or more exemplary embodiments.

Referring to FIG. 15, an optical mask 2003 differs from the optical mask 2000 of FIG. 5 in that no adiabatic layer 2300 is provided between a reflective pattern layer 2200 and a photothermal conversion layer 2400. In the optical mask 2003, the photothermal conversion pattern layer 2400 may be formed not only on a first surface of the reflective pattern layer 2200, but also on parts of a first surface of a transmissive base substrate 2100 exposed through a plurality of incisions 2201.

Figure 16:
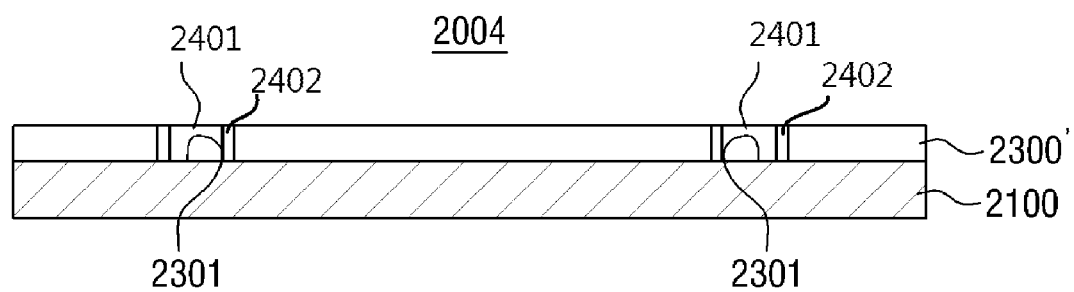
FIG. 16 is a cross-sectional view of an optical mask, according to one or more exemplary embodiments.

FIG. 16 is a cross-sectional view of an optical mask, according to one or more exemplary embodiments.

Referring to FIG. 16, an optical mask 2004 differs from the optical mask 2000 of FIG. 5 in that an adiabatic pattern layer 2300' is formed on a first surface of a transmissive base substrate 2100 to have a plurality of segments and a photothermal conversion pattern layer 2400 is also formed on the first surface of the transmissive base substrate 2100 to have a plurality of segments, which are disposed between the segments of the adiabatic pattern layer 2300. The optical mask 2004 differs from the optical mask 2000 of FIG. 5 in that the photothermal conversion pattern layer 2400 is formed on the transmissive base substrate 2100 through patterning, and that the adiabatic pattern layer 2300' is formed to be disposed on either side of each of the segments of the photothermal conversion pattern layer 2400.

The adiabatic pattern layer 2300', like a transmissive buffer layer, may prevent the diffusion of heat on either side of each of the segments of the photothermal conversion pattern layer 2400. The adiabatic pattern layer 2300' may be formed of the same material as a transmissive buffer layer, and may serve the same functions as a transmissive buffer layer. Since the photothermal conversion pattern layer 2400 is formed on the transmissive base substrate 2100 through patterning, beams emitted from a flash lamp (not illustrated) may be converted into heat by the photothermal conversion pattern layer 2400 without the aid of a reflective pattern layer 2200, which defines transmissive areas TP and non-transmissive areas NTP. Even though not specifically illustrated, the adiabatic pattern layer 2300' may be formed on the entire first surface of the transmissive base substrate 2100, and one or more grooves may be provided on the adiabatic pattern layer 2300' for receiving the photothermal conversion pattern layer 2400.

Figure 17:
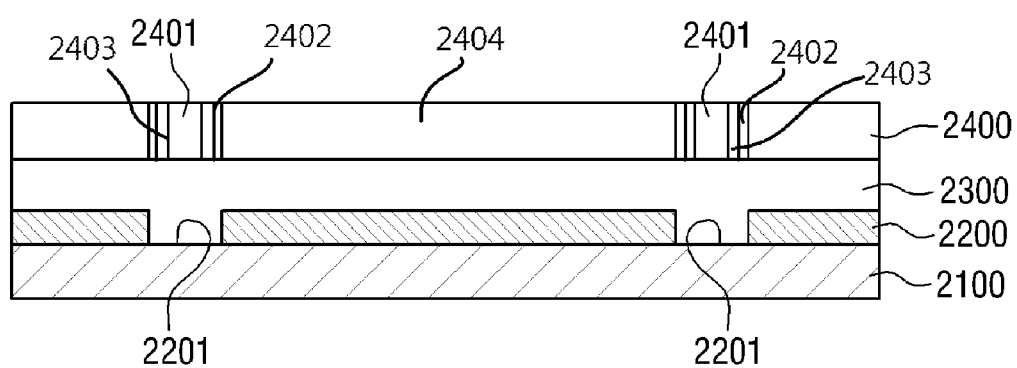
FIG. 17 is a cross-sectional view of an optical mask, according to one or more exemplary embodiments.

FIG. 17 is a cross-sectional view of an optical mask, according to one or more exemplary embodiments.

Referring to FIG. 17, an optical mask 2005 may include a photothermal conversion pattern layer 2400. In each transmissive area TP, the photothermal conversion pattern layer 2400 may be divided into a low-absorptivity region 2401, a medium-absorptivity region 2403 and a high-absorptivity region 2402. The optical mask 2005 differs from the optical mask 2000 of FIG. 5 in that the photothermal conversion pattern layer 2400 is formed of three materials with different light absorptivity through patterning.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An optical mask, comprising:
    a transmissive base substrate;
    a reflective pattern layer disposed on the transmissive base substrate, the reflection pattern layer comprising reflectors; and
    a photothermal conversion pattern layer disposed on the transmissive base substrate among the reflectors, the photothermal conversion pattern layer comprising first regions with a first light absorptivity and second regions with a second light absorptivity,
    wherein the second light absorptivity is greater than the first light absorptivity, and
    wherein the first regions are disposed among the second regions.

2. The optical mask of claim 1, further comprising:
    an adiabatic layer disposed between the transmissive base substrate and the photothermal conversion pattern layer.

3. The optical mask of claim 2, wherein the adiabatic layer is disposed on at least some of the reflectors.

4. The optical mask of claim 3, wherein at least some of the second regions are disposed on the adiabatic layer.

5. The optical mask of claim 4, further comprising:
a buffer pattern layer disposed on at least some of the second regions, the buffer pattern layer comprising a barrier overlapping at least some of the reflectors.

6. The optical mask of claim 2, further comprising:
a photothermal conversion layer configured between the adiabatic layer and the photothermal conversion pattern layer; and
a metal oxide layer between the photothermal conversion layer and the photothermal conversion pattern layer.

7. The optical mask of claim 6, wherein:
the photothermal conversion layer comprises at least one material selected from the group consisting of molybdenum (Mo), chromium (Cr), titanium (Ti), tin (Sn), tungsten (W), and an alloy comprising at least one of Mo, Cr, Ti, Sn, and W; and
the metal oxide layer comprises at least one material selected from the group consisting of indium tin oxide (ITO), indium zinc oxide (IZO), and indium gallium zinc oxide (IGZO).

8. The optical mask of claim 2, wherein a thermal conductance of the adiabatic layer is greater than zero and less than or equal to 1.5 W/mK.

9. The optical mask of claim 1, wherein light absorptivity of the first regions and the second regions is at least 50% in the infrared-visible light range.

10. The optical mask of claim 9, wherein the first regions and the second regions are comprise at least one material selected from the group consisting of molybdenum (Mo), chromium (Cr), titanium (Ti), tin (Sn), tungsten (W), and an alloy comprising at least one of Mo, Cr, Ti, Sn, and W.

11. The optical mask of claim 1, wherein a difference between the light absorptivity of the first regions and the light absorptivity of the second regions ranges from about 10% to about 40%.

12. An optical mask, comprising:
a transmissive base substrate;
an adiabatic pattern layer disposed on the transmissive base substrate, the adiabatic pattern layer comprising adiabatic structures; and
a photothermal conversion pattern layer disposed on the transmissive base substrate among the adiabatic structures, the photothermal conversion pattern layer comprising first regions with a first light absorptivity and second regions with a second light absorptivity,
wherein the second light absorptivity is greater than the first light absorptivity, and
wherein the first regions are disposed among the second regions.

13. The optical mask of claim 12, wherein light absorptivity of the first regions and the second regions is at least 50% in the infrared-visible light range.

14. The optical mask of claim 13, wherein the first regions and the second regions comprise at least one material selected from the group consisting of molybdenum (Mo), chromium (Cr), titanium (Ti), tin (Sn), and tungsten (W), and an alloy comprising at least one of Mo, Cr, Ti, Sn, and W.

15. The optical mask of claim 12, wherein a difference between the light absorptivity of the first regions and the light absorptivity of the second regions ranges from about 10% to about 40%.

16. The optical mask of claim 12, further comprising:
a buffer pattern layer disposed on at least some of the adiabatic structures, the buffer pattern layer comprising a barrier.

17. The optical mask of claim 12, further comprising:
a photothermal conversion layer disposed between the adiabatic pattern layer and the photothermal conversion pattern layer; and
a metal oxide layer disposed between the photothermal conversion layer and the photothermal conversion pattern layer.

18. The optical mask of claim 17, wherein:
the photothermal conversion layer comprises at least one material selected from the group consisting of molybdenum (Mo), chromium (Cr), titanium (Ti), tin (Sn), tungsten (W), and an alloy comprising at least one of Mo, Cr, Ti, Sn, and W; and
the metal oxide layer comprises at least one material selected from the group consisting of indium tin oxide (ITO), indium zinc oxide (IZO), and indium gallium zinc oxide (IGZO).

19. The optical mask of claim 12, wherein a thermal conductance of the adiabatic pattern layer is greater than zero and less than or equal to 1.5 W/mK.

* * * * *